United States Patent [19]
Dohkoshi et al.

[11] Patent Number: 4,737,852
[45] Date of Patent: Apr. 12, 1988

[54] PHOTOELECTRIC IMAGE SENSOR

[75] Inventors: Hitoshi Dohkoshi, Nagano; Masakazu Ueno, Yokosuka; Toshiaki Kato, Kanagawa, all of Japan

[73] Assignee: Fuji Electric Co., Ltd., Kawasaki, Japan

[21] Appl. No.: 864,036

[22] Filed: May 16, 1986

[30] Foreign Application Priority Data

May 16, 1985 [JP] Japan ................. 60-104377

[51] Int. Cl.$^4$ ............................................. H04N 3/14
[52] U.S. Cl. ........................... 358/213.11; 358/213.31
[58] Field of Search ............... 358/213, 212, 294, 293, 358/213.11, 213.15, 213.18, 213.19, 213.31; 250/578

[56] References Cited

U.S. PATENT DOCUMENTS

| | | | |
|---|---|---|---|
| 4,408,230 | 10/1983 | Tamura et al. | 358/293 |
| 4,479,149 | 10/1984 | Yoshioka et al. | 358/293 |
| 4,567,374 | 1/1986 | Takenouchi et al. | 250/578 |
| 4,570,076 | 2/1986 | Hamano et al. | 250/578 |

Primary Examiner—Jin F. Ng
Assistant Examiner—Stephen Brinich
Attorney, Agent, or Firm—Brumbaugh, Graves, Donohue & Raymond

[57] ABSTRACT

An image sensor of the kind which employs a line array of a-Si photodiodes on an insulating substrate and in which the outputs of the diodes are stored in the lead capacitances until readout. To increase the size of the lead capacitance and thereby to improve the linearity of the ouput, the lead between each diode and its processing circuit is made one plate of a capacitor, of which the other plate is a metal film insulated from the lead and advantageously maintained at ground.

5 Claims, 4 Drawing Sheets

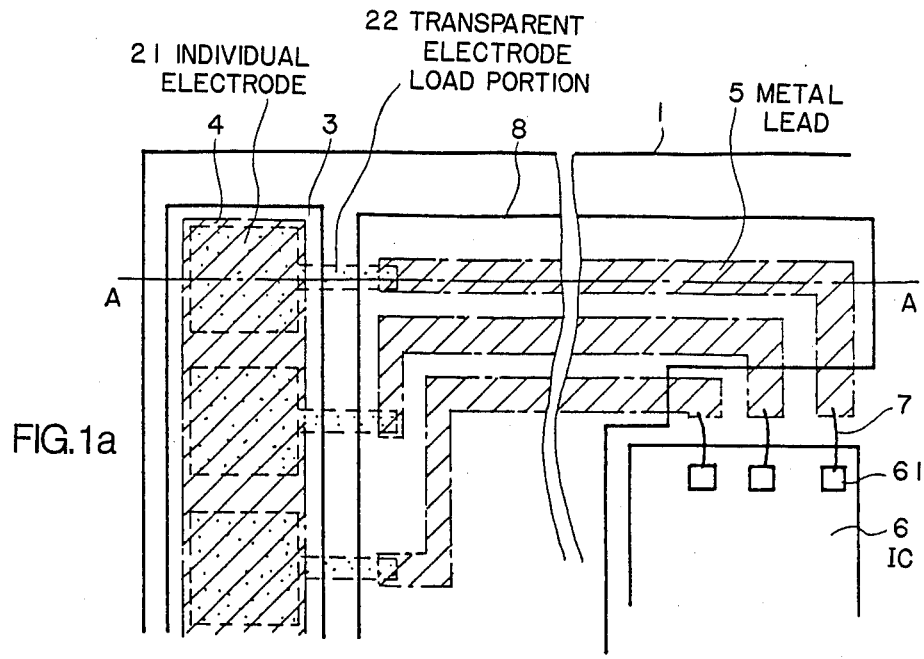
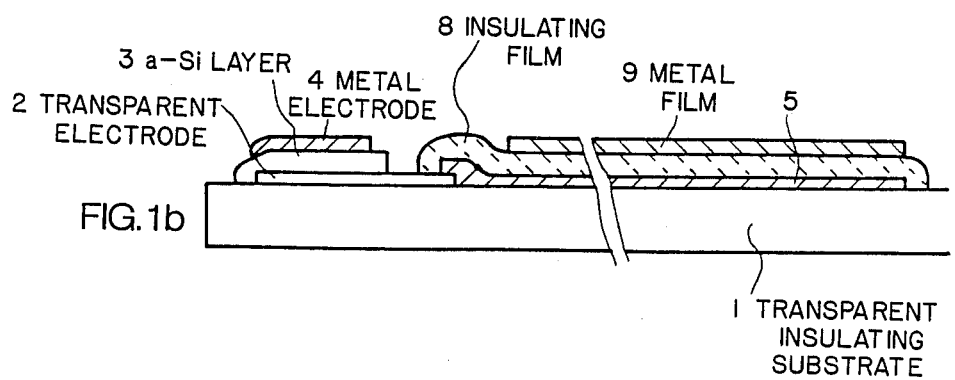

PHOTOELECTRIC IMAGE SENSOR

BACKGROUND OF THE INVENTION

This invention relates to an image sensor of the hybrid type having an insulating substrate which supports a number of photoelectric pickup conversion elements arranged in a row and a thin-film IC for control, such as for signal readout. Such sensors are particularly useful in facsimile transmission systems.

Because of the desire for miniaturization and cost-reduction, contact-type image sensors using semiconductors are growing in popularity. Such sensors typically include an array of photoelectric elements or pick-ups aligned in a row, for example 8 per millimeter or 1728 elements in a width of 216 mm for use with a typical scratch pad. Generally the array of elements is moved past the manuscript to be read a line at a time while the manuscript is illuminated by an array of light-emitting diodes. A lens array is usually used to focus the light reflected from the manuscript on the array of photoelectric elements.

To realize the operation speed desired, the readout time per scan should be of the order of 4 ms or less. To cope with such circumstances, a sensor using amorphous silicon (a-Si) has been developed.

FIG. 2 shows an example of the conventional sensor using a-Si, in which (a) is a top plan view and (b) a sectional view taken along line B—B of (a). On a transparent insulating substrate 1 there are formed photodiodes, each functioning as a sensor pickup element capable of responding to a light signal entering from the side of the substrate, and each comprising a transparent electrode 2 functioning as an individual electrode, an a-Si layer 3, and a metal electrode 4 functioning as a common electrode. The transparent electrode 2 is made of a transparent conductive film 500—2000 Å thick; the a-Si layer 3 is provided in known fashion and includes a p-type layer of about 100 Å thick, an undoped i-layer of about 0.5 μm thick, and n-type layer of about 500 Å thick in this order from the side of the transparent electrode, and the metal electrode 4 has a thickness of about 1 μm. Each of the transparent electrodes 2, of which there are 8 per 1 mm, is composed of an individual electrode portion 21 of 100 square μm and a narrow lead portion 22. These are patterned by the use of the photolithography from a coating of the transparent conductive film. The separate lead portions 22 of the transparent electrode are connected to metal leads 5; each metal lead 5 is for transferring signals to an input pad 16 of an IC 6 for processing light signals from the sensor elements, and its pattern is formed by the use of the photolithography process after evaporation. Connection between the end of each metal lead 5 and the pad 16 of the IC 6 is realized by a bonded wire 7.

FIG. 3 shows an equivalent circuit of each sensor element for use in explaining the signal readout operation. The photodiode 31 is an a-Si diode made up of the foregoing three, p-i-n, layers to which a reverse bias of 5 V is applied. Photoelectric current yielded here is charged into the lead capacitance represented by the lumped capacitor 33 while the switch 32 is open. The charging time corresponds to about the time of one scan and is of the order of 4 ms. These photodiodes 31, analog switches 32, etc. of which there are 1728 are connected in parallel to a current-voltage converting circuit 34. FIG. 2 illustrates one set only. The charge stored in each lead capacitance 33 is discharged through an inductance component 35 of the wiring by turning on the 1728 switches 32 successively; thus, by discharging the integrated current thus stored each time the switch is closed, one-dimensional picture information is provided corresponding to the illumination intensity of the light incident on the succession of photodiodes 31.

Letting I(t) be the charging current, the amount Q of charge accumulated within a certain time t is represented by the following equation:

$$Q = \int_0^t I(t) \cdot dt \qquad (1)$$

If I(t) were constant, Q becomes proportional to I; but, it is not actually constant because the voltage at point 36 of FIG. 3 rises during charging. Accordingly, the voltage across the photodiode 31 also changes. That is, I(t) is not constant and is represented by the following equation:

$$I(t) = I_{SV} - \frac{\Delta I}{\Delta V} V_A(t) \qquad (2)$$
$$= I_{SV} - \frac{\Delta I}{\Delta V} \cdot \frac{Q(t)}{C}$$

Namely, I(t) decreases at the rate, $(\Delta I/\Delta V) \cdot Q/C$, where $(\Delta I/\Delta V)$ is the slope of the current-voltage characteristic of the photodiode.

FIG. 4 shows the current-voltage characteristic measured in an actual a-Si diode. Even though it depends on the processing conditions of the a-Si, the normalized $(\Delta I/\Delta V)$ is estimated at about 3% per 1 V. On the other hand, as will be apparent from the equation (2), if the wiring or lead capacitance C were large enough, the change of I(t) would become small. Increasing the length of the metal lead 5 will increase C. However, if the circuit is designed as shown, the inductance component 35 increases correspondingly, and the charge will not be discharged completely when discharging by closing the switch 32. This can lead to errors and to extra noise; thus, the foregoing measure is not practical.

Conversely, it is found that if the length of the lead 5 is shortened, the rate of change of the charging current becomes excessively large at high illumination intensity and the linearity is lost which makes for poor fidelity of picture reproduction.

SUMMARY OF THE INVENTION

To realize the above object, the invention employs the technique of increasing the lead capacitance which the photoelectric current charges during the scanning cycle without increasing commensurately the inductance by using the lead wiring as one plate of a capacitor, the other plate being formed by an added metallic film spaced apart from the lead wiring by an insulating layer. Advantageously, such other plate is maintained at a reference potential for example, ground. By this expedient, the charging current is made more uniform and the linearity of the output-illumination characteristic is improved.

Moreover, this metal layer may be designed to serve additionally as a shield to screen out stray light other than the picture light, with a consequent improvement in the signal-to-noise ratio of the sensor. Also, there can be improved resistance to moisture of the sensor.

BRIEF DESCRIPTION OF THE DRAWING

FIGS. 1(a) and 1(b) show a plan view and a sectional view taken along the line A—A of FIG. 1a, respectively, of an embodiment of the invention;

DETAILED DESCRIPTION OF THE INVENTION

Figure 2A:
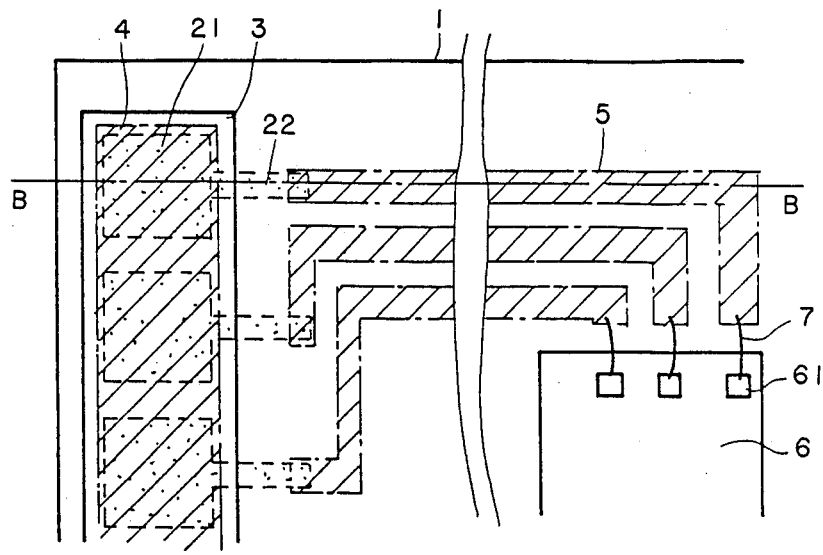
FIGS. 2(a) and 2(b) similarly show a prior art form of image sensor.
Figure 2B:
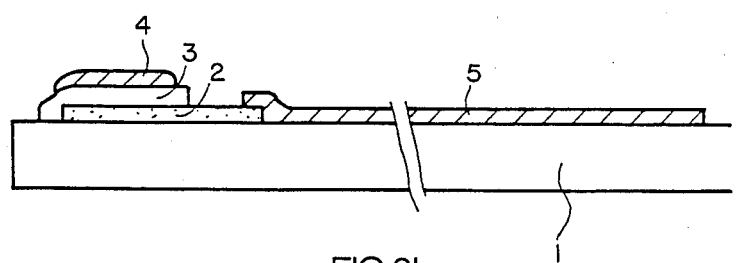
Figure 3:
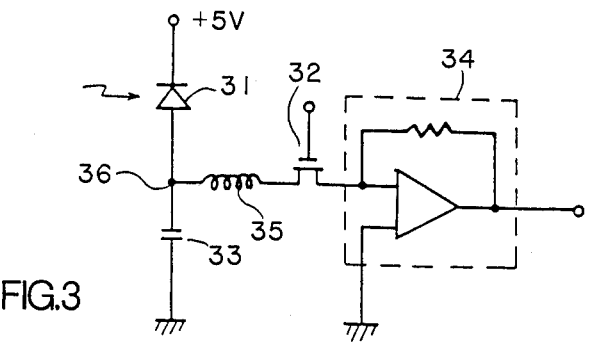
FIG. 3 shows the equivalent circuit of a single pickup element useful in explaining the readout operation.
Figure 4:
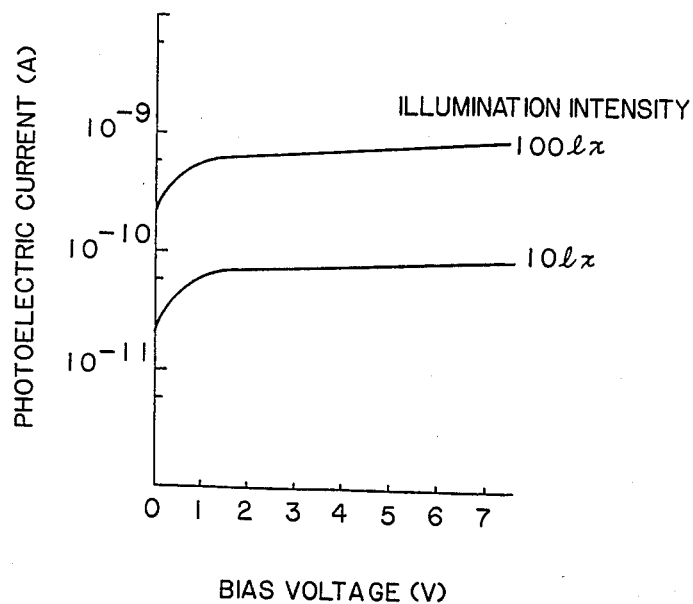
FIG. 4 shows the current-voltage characteristic of an a-Si photodiode.

FIGS. 1 shows an embodiment of the present invention, in which (a) is a plan view and (b) is a sectional view taken along line A—A of (a) with the identical portions to that of FIG. 2 being indicated by the same reference numerals. Similarly to the case of FIG. 2, the photodiode made up of the transparent electrode 2, a-Si layer 3, and metal electrode 4 is formed on the transparent insulating substrate 1, typically glass. The lead portion 22 of the transparent electrode 2 is connected to the metal lead 5 to transfer a signal to the terminal 16 of the IC 6 for processing the light signals given from the photodiodes. An insulating film 8 is formed on a portion of the surface so as to cover the metal lead 5 and a metal thin-film 9 is formed thereover, seen in FIG. 1(b). The insulating film 8 is provided, for example, by applying epoxy resin to a thickness of about 20 μm by the use of the screen printing process and firing the same at about 200° C. Such an insulating film 8 will function also as a moisture-resistant coat to protect the metal lead 5 from corrosion. The metal film 9 typically is made up of Al, or Ti, or a layer of each formed through evaporation.

Figure 5:
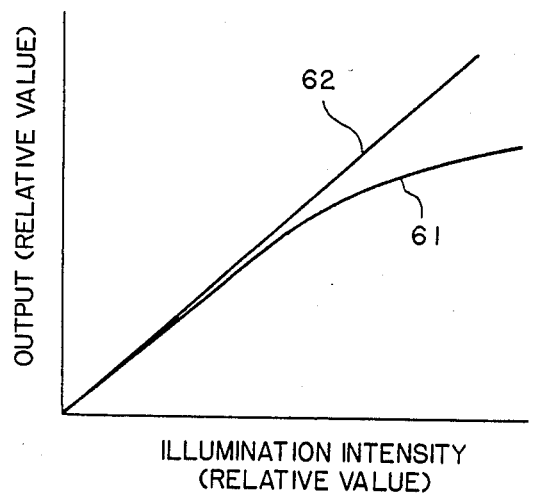
FIG. 5 is a diagram comparing the illumination-output signal characteristics of a conventional image sensor and one in accordance with the invention.

By grounding electrically the metal film 9 the wiring or lead capacitance increases significantly. In this embodiment, assuming the relative permittivity of epoxy resin to 5, C becomes about 800 pF, the rate of change of the charge current, $-(\Delta I/\Delta V) \cdot Q/C$, calculated by the equation (2) becomes about 0.015% which is insignificant. As depicted by the line 62 of FIG. 5, the output exhibits a favorable linearity with respect to the illumination intensity.

Figure 6A:
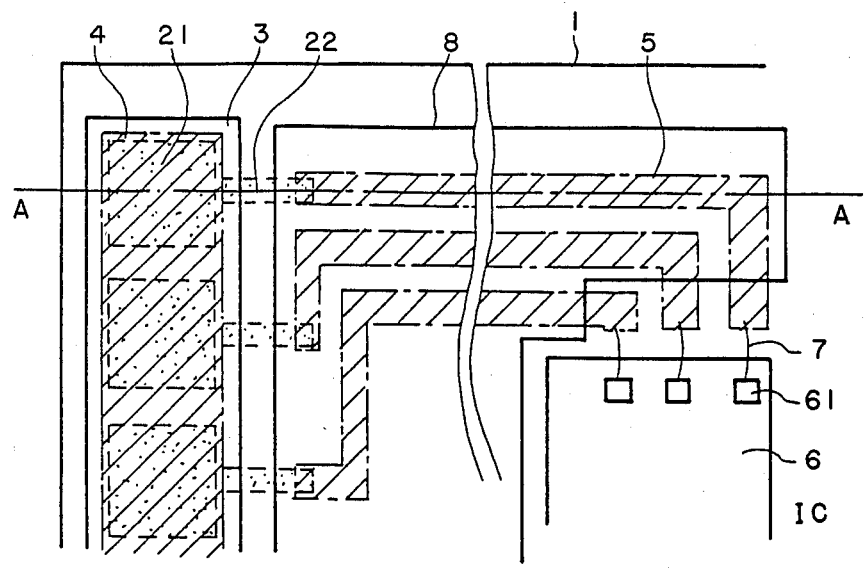
FIGS. 6a and 6(b) show in the manner of FIGS. 1(a) and 1(b) another embodiment of the invention.
Figure 6B:
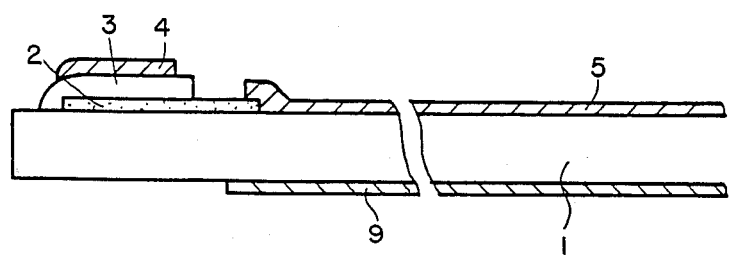

FIG. 6 shows another embodiment of the present invention, in which (a) is a plan view and (b) is a sectional view taken along line A—A of (a) with the identical portions to those of FIG. 1 being indicated by the same reference numeral. Similarly to the case of FIG. 1, the photodiode made up of the transparent electrode 2, a-Si layer 3, and metal electrode 4 is formed on a transparent insulating substrate 1, such as glass. The lead portion 22 of the transparent electrode 2 is connected to the metal lead 5 to transfer a signal to the terminal 61 of the IC 6 for processing the light signals given from the photodiodes.

On the bottom surface of the glass layer, opposite the metal lead 5 is formed the metal film 9 by evaporating, for example, Ti, or Al, or a layer of each. This film can also be formed by applying a conductive paste. By grounding electrically this metal film 9 the wiring capacitance increase significantly. In this embodiment, assuming the thickness of the glass to be 1 mm and its relative permittivity to be 5, C becomes about 200 pF and the rate of change of the charge current, $-(\Delta I/\Delta V) \cdot Q/C$, calculated by the equation (2) becomes about 0.6% which is still negligible.

The present invention involving a hybrid stype image sensor increases the wiring capacitance for storing the signal charge without increasing the inductance component by forming a capacitor of the wiring extending from the electrode of the individual photoelectric pickup element to the corresponding processing circuit provided on the insulating substrate. This makes it possible to increase the linearity of the signal output.

Further, since the metal film functions also as a shield and screens stray light other than the picture light, the signal-to-noise ratio of the image sensor is improved correspondingly, Moreover, by use of a separate insulating film, the moisture resistivity of the image sensor can be improved.

We claim:

1. An image sensor comprising an insulating substrate on which is supported a linear array of individual electrodes, a layer of photoconductor material overlying the linear array of electrodes, and a common electrode overlying the layer of photoconductor material, and a plurality of individual leads each being supported on the insulating substrate and having an associated capacitance and connected to a respective one of the plurality of electrodes for supplying output charge picked up on an individual electrode to a processing circuit, the output charge of each individual electrode being stored in the capacitance associated with its lead until such individual electrode is selected for readout, characterized in that an insulating layer lies over the plurality of leads and a separate metal film lies on the insulating layer and over the leads for forming a separate capacitor with each lead.

2. The image sensor of claim 1 in which the individual electrodes are of uniform size.

3. An image sensor comprising an insulating substrate on which is supported a linear array of individual electrodes, a layer of photoconductor material overlying the linear array of electrodes, and a common electrode overlying the layer of photoconductor material, and a plurality of individual leads, each being supported on the insulating substrate and having an associated capacitance and connected to a respective one of the plurality of electrodes for supplying output charge picked up on an individual electrode to a processing circuit, the output charge of each individual electrode being stored in the capacitance associated with said lead until such individual electrode is selected for readout, characterized in that an insulating layer lies over the plurality of leads and a separate metal film lies under the insulating substrate and opposite the plurality of leads.

4. The image sensor of claim 1 including means for maintaining the metal film at a reference potential.

5. The image sensor of claim 3 including means for maintaining the metal film at a reference potential.

* * * * *

UNITED STATES PATENT AND TRADEMARK OFFICE
CERTIFICATE OF CORRECTION

PATENT NO.  : 4,737,852
DATED       : April 12, 1988
INVENTOR(S) : Dohkoshi et al.

It is certified that error appears in the above-identified patent and that said Letters Patent is hereby corrected as shown below:

First page, add to Item 30:   --May 16, 1985   Japan 60-104378--.

Signed and Sealed this

Eighth Day of November, 1988

Attest:

DONALD J. QUIGG

*Attesting Officer*        *Commissioner of Patents and Trademarks*